(12) United States Patent
Polnyi

(10) Patent No.: US 7,819,693 B2
(45) Date of Patent: Oct. 26, 2010

(54) LGA SOCKET HAVING IMPROVED STANDOFF

(75) Inventor: Igor Polnyi, Aurora, IL (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/286,650

(22) Filed: Sep. 30, 2008

(65) Prior Publication Data

US 2010/0081328 A1     Apr. 1, 2010

(51) Int. Cl.
*H01R 13/73* (2006.01)
*H02B 1/01* (2006.01)

(52) U.S. Cl. .................. 439/573; 439/331; 439/71
(58) Field of Classification Search .............. 439/331, 439/71, 73, 573, 564; 411/999, 532, 529, 411/522, 523, 511, 533
See application file for complete search history.

(56) References Cited

U.S. PATENT DOCUMENTS

| 6,579,123 | B2 * | 6/2003 | Kasahara | 439/573 |
| 6,733,335 | B2 * | 5/2004 | Wu | 439/573 |
| 7,278,860 | B2 * | 10/2007 | Ma | 439/73 |
| 7,331,818 | B2 * | 2/2008 | Wu | 439/573 |
| 7,364,442 | B2 * | 4/2008 | Bang et al. | 439/564 |
| 7,381,102 | B2 * | 6/2008 | Camacho | 439/573 |
| 7,387,523 | B2 * | 6/2008 | Hsu | 439/331 |
| 7,402,065 | B1 | 7/2008 | Polnyi | |

* cited by examiner

*Primary Examiner*—Felix O Figueroa
(74) *Attorney, Agent, or Firm*—Andrew C. Cheng; Wei Te Chung; Ming Chieh Chang

(57) ABSTRACT

An LGA socket includes an insulative housing, a number of conductive terminals received retained in the housing, a stiffener surrounding the insulative housing, a load plate and a load lever pivotally assembled to the stiffener, and a locking mechanism. The locking mechanism includes a screw attached to the stiffener in a horizontal direction and a washer attached to the support plate in a vertical direction. The locking mechanism is attached to the stiffener before the LGA socket mounting to a printed circuit board.

13 Claims, 10 Drawing Sheets

LGA SOCKET HAVING IMPROVED STANDOFF

BACKGROUND OF THE INVENTION

1. Field of the Invention

The present invention relates to a socket, on which an LGA (land grid array) integrated circuit (IC) package is mounted.

2. Description of Related Art

Modern computer systems increase in performance and complexity at a very rapid pace, driven by intense competition and market demands. In order to meet ever-increasing performance requirements, the area and volumetric interconnect densities of electronic board assemblies must increase accordingly. In combination with other competitive forces, this demand has driven the need for improved high-density socket technologies in computer applications, and the connector industry has responded with a variety of new alternatives to meet these needs. One of the most attractive of the new connector types is the land grid array (LGA) socket, which permits direct electrical connection between an LGA integrated circuit and a printed circuit board. LGA sockets are an evolving technology in which an interconnection between mating surfaces of an IC or other area array device and a printed circuit board is provided through a conductive terminal received in the socket. Connection is achieved by mechanically compressing the IC onto the socket.

A typical type of socket for carrying an IC package and electrically connecting the IC package to a circuit board, e.g. a PCB comprises a metallic stiffener, an insulative housing, a load plate, a load lever and a plurality of plastic supporting posts. The stiffener defines a central opening in a middle portion thereof, the opening being surrounded by two pairs of inner surfaces. The housing defines a recessed conductive zone surrounded by sidewall. The stiffener defines a plurality of through holes on four corners thereof. The plastic supporting posts are partially received in the through holes and arranged between the stiffener and the circuit board. A plurality of screws passes through the through holes for mounting the stiffener onto the circuit. The plurality of plastic supporting posts is used for separating the stiffener from the circuit board; therefore the stiffener is easily removed. Apparently, the plastic supporting posts don't carry function of attachment stiffener to the circuit board and mechanical connection between the stiffener and the circuit board is unsteady.

Another type of LGA socket is provided with captive screws in different configuration and assemblies with captive components. The screws are mounted to the circuit board for securing the stiffener on the circuit board. During the product shipment and assembly, the screws are apart from the stiffener. Therefore, when system manufactures assemble the LGA socket to the circuit board, the screws are easily lost on the board and the time is increased on assembly. Furthermore, it is not acceptable for high cost per special screw.

Accordingly, there is a room for improving the existing socket such that the cost and the assembly time are reduced.

BRIEF SUMMARY OF THE INVENTION

An LGA socket comprising an insulative housing defining a conductive region surrounded by two pairs of sidewalls, a plurality of conductive terminals received in the conductive region, a stiffener surrounding the insulative housing, a load plate and a load lever pivotally assembled to the stiffener, and a locking mechanism. The stiffener includes a plurality of support plates at corners thereof and each support plate defines a side-opening slot. The locking mechanism includes a screw attached to the slot in a horizontal direction and a washer attached to the support plate in a vertical direction. The washer is provided with a through hole for the screw pass through.

Other advantages and novel features of the present invention will become more apparent from the following detailed description when taken in conjunction with the accompanying drawings, in which:

DETAILED DESCRIPTION OF THE PREFERRED EMBODIMENT

Hereinafter, a preferred embodiment of the invention will be described in detail with reference to the attached drawings.

Figure 1:
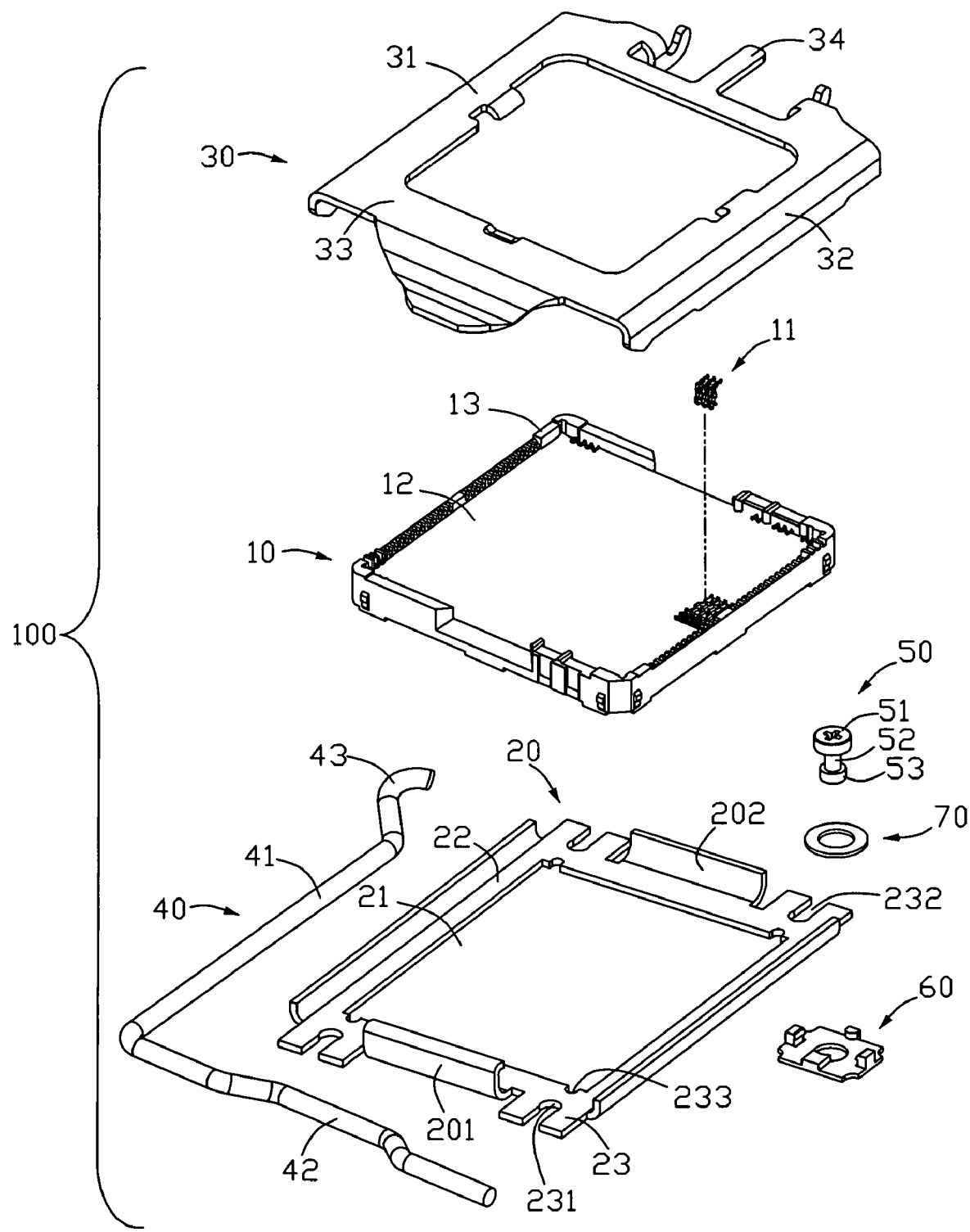
FIG. 1 is an exploded isometric view of an LGA socket in accordance with a preferred embodiment of the present invention.
Figure 2:
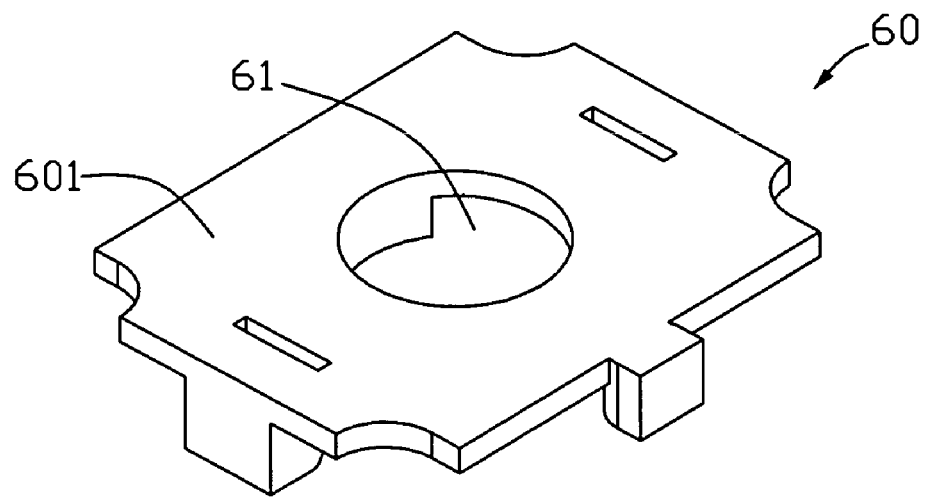
FIG. 2 is an isometric view of a washer of the LGA socket shown in FIG. 1.
Figure 3:
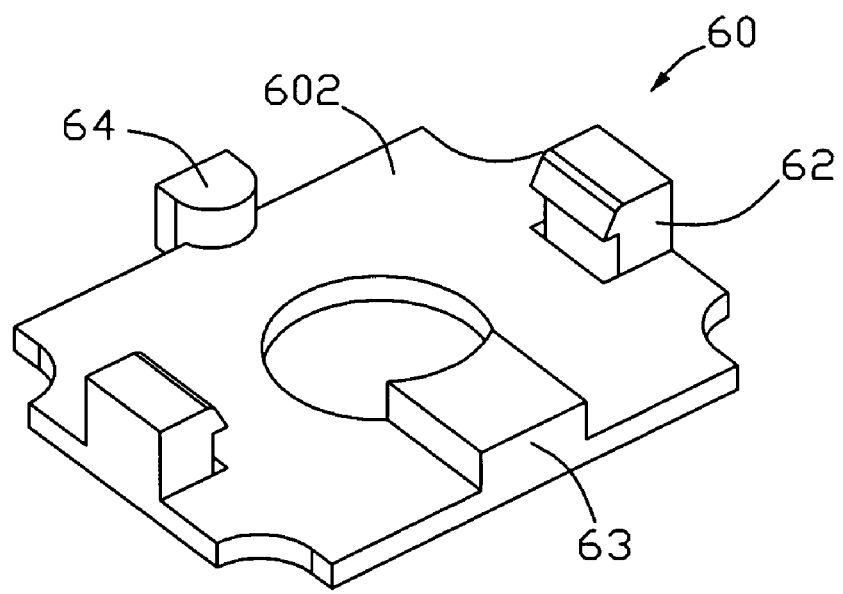
FIG. 3 is similar to FIG. 2, but from another perspective view
Figure 4:
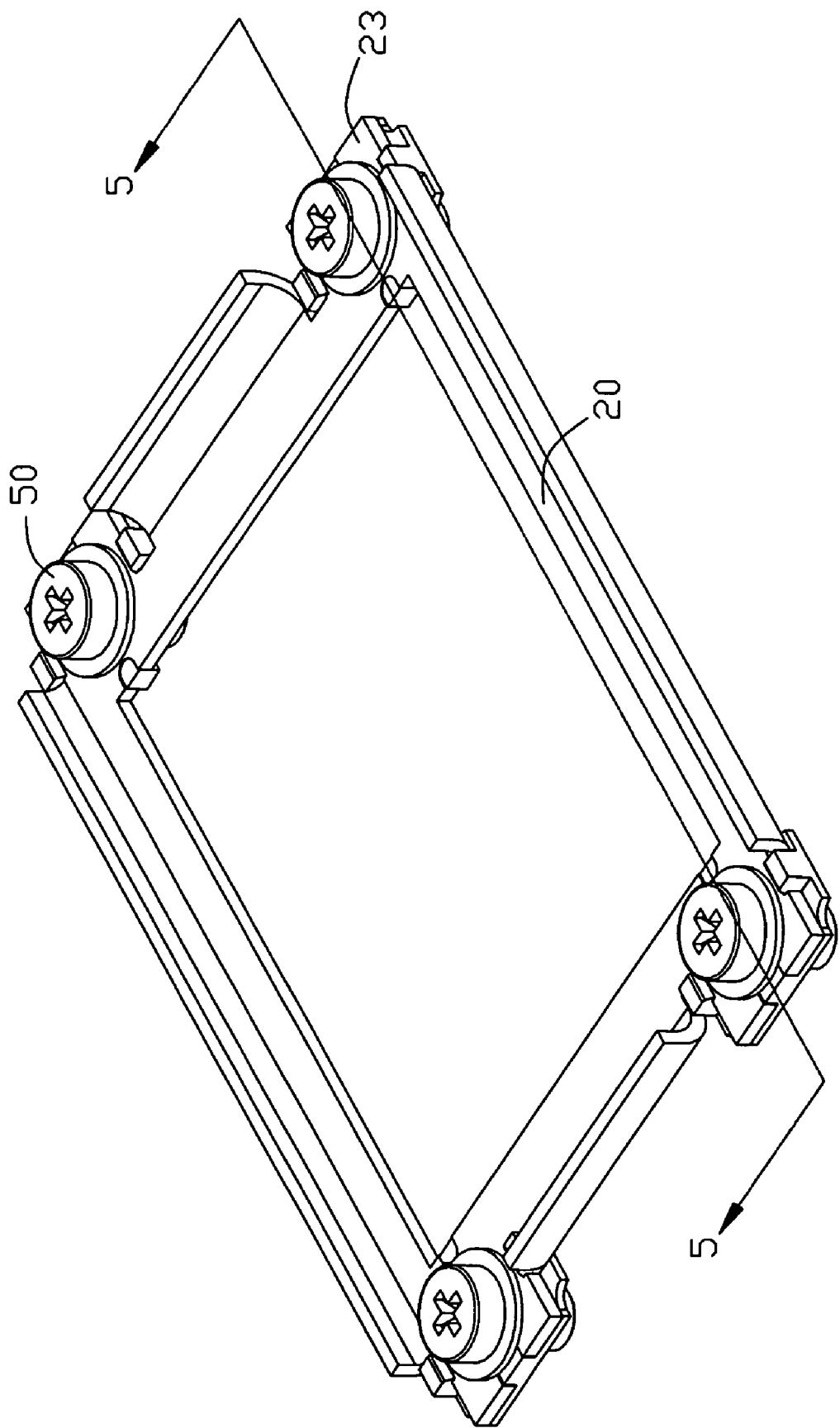
FIG. 4 is an assembled view of the stiffener and the locking mechanism, showing each of the slots assembled with a screw and a washer.
Figure 5:
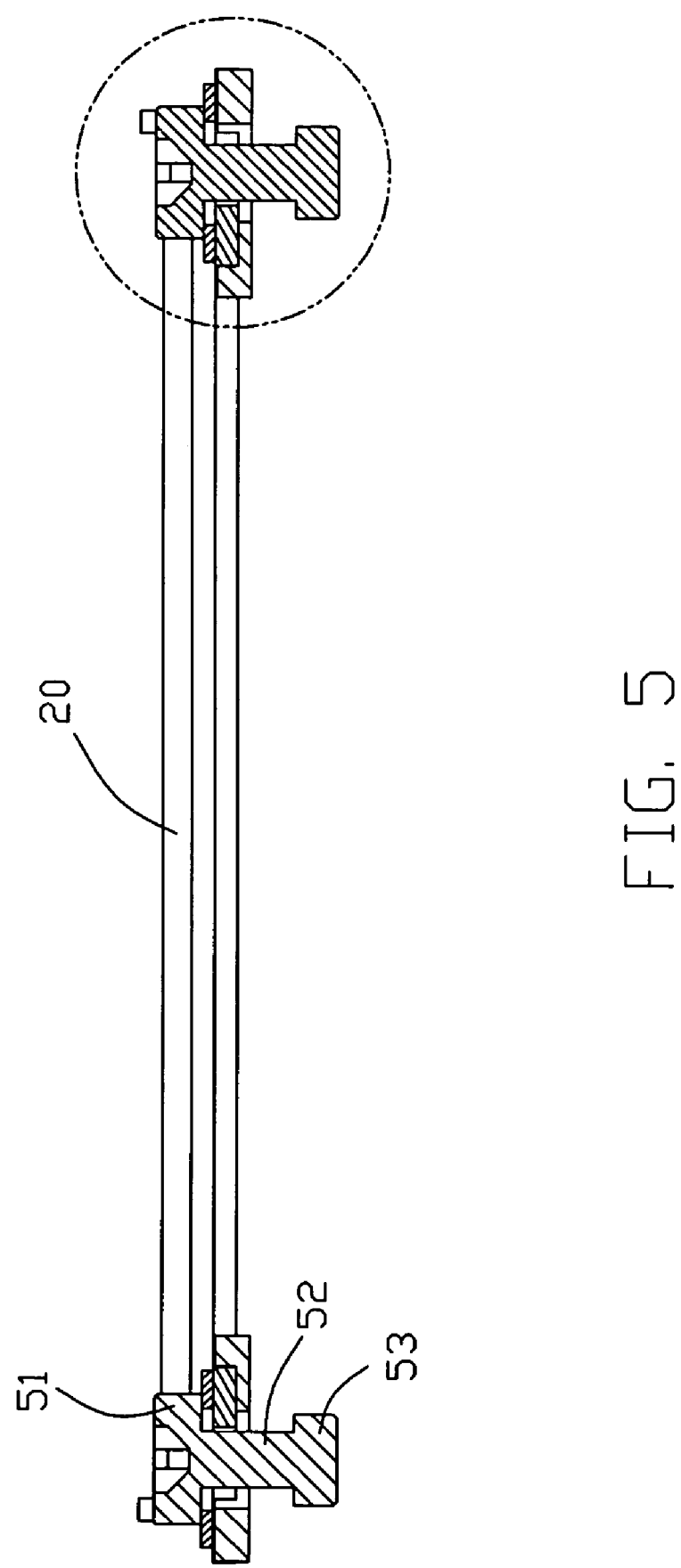
FIG. 5 is a cross-sectional view along line 5-5 in FIG. 4.
Figure 6:
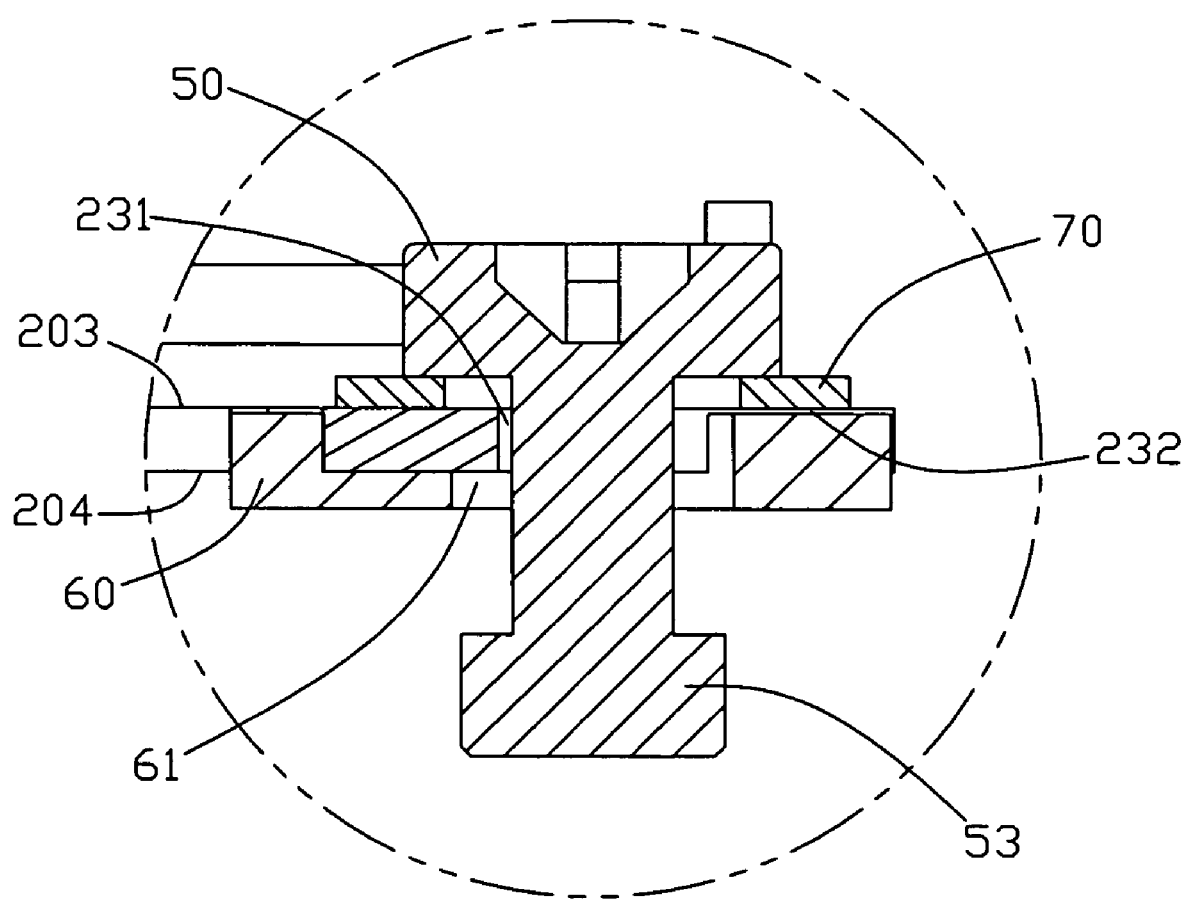
FIG. 6 is an enlarged view of the circle portion in FIG. 5.

Referring to FIG. 1, an LGA socket 100 for carrying an IC package (not shown) to be electrically connected to a printed circuit board (not shown). The LGA socket 100 comprises an insulative housing 10, a metallic stiffener 20 surrounding the insulative housing 10, a plurality of conducive terminals 11 received in the insulative housing 10, a load plate 30 pivotally assembled to one end of the stiffener 20, a load lever 40 pivotally assembled to the other end of the stiffener 20, and a locking mechanism attached to the stiffener 20.

The insulative housing 10 defines a recessed conductive region 12 surrounded by two pairs of sidewalls 13. The terminals 11 are fixed in the conductive region 12.

The metallic stiffener 20 is formed by stamping form a metallic sheet. The stiffener 20 defines an opening 21 in a middle portion thereof for receiving the insulative housing 10. The opening 21 is generally rectangular and is surrounded by two pairs of bottom plates 22. The stiffener 20 defines a first end 201 and a second end 202 separated by the opening 21. The stiffener 20 comprises a plurality of support plates 23 at corners thereof and surrounding the opening 21. Each support plate 23 defines a side-opening slot 231. In this embodiment, the slots 231 are arranged at four corners of the stiffener 20. The stiffener 20 defines an upper surface 203 and a lower surface 204 opposite to the upper surface 203. The slots 231 extend through the upper surface 203 and the lower surface 204 in a vertical direction. The support plate 23 further defines a cutout 232 communicated with the slot 231. In this embodiment, the sidewalls 13 of the insulative housing 10 are interferentially engaged with the opening 21. Furthermore, in an alternative embodiment, the insulative housing can be surrounded by the opening but without interference therebetween.

The load plate 30 is generally rectangular and includes a rear end 31, a front end 32 and two opposed pressing beams 33, 34 connected therewith. The load lever 40 is generally L-shaped, and comprises a pivotal section 41, a pressing section 42 protruding from the pivotal section 41, and an operating section 43 extending form a distal end of the pivotal section 41. In assembly, the load plate 30 and the load lever 40 are received in opposite ends of the stiffener 20, respectively.

Referring to FIGS. 2-6, the locking mechanism including a screw 50 attached to the slot 231 of the support plate 23 in a horizontal direction, a washer 60 attached to the support plate 30 in a vertical direction, and a gasket 70 secured between the screw 50 and the support plate 23. The washer 60 is provided with a close through hole 61 for the screw 50 pass through in a vertical direction. The washer 60 defines a flat bottom surface 601 projecting downwardly from the support plate 23 and a top surface 602 opposite to the bottom surface 601. The washer 60 comprises a plurality of snapped sections 62 for engaging with the support plate 23, a first protrusion 63 received in the side-opening slot 231, and a second protrusion 64 received in another hole 233 of the support plate 23.

The screw 50 comprises a head 51 supported on the support plate 23 at one end and a cylindrical shaft 52 at other end with a thread 23 formed thereon. The diameters of the head 51 and the thread 53 are more than the diameter the cylindrical shaft 52. The diameter of the slot 231 on the support plate 23 is less than the diameter of the thread 53 of the screw 50. The length of the cut-out 232 is substantially equal to the diameter of the screw 50 so that the screw 50 can be inserted into the slot 231 through the cut out 232. The screw 50 is movably along the vertical direction and is limited in a horizontal plane. In assembly, push the screw 50 into support plate 23 through the cut out 232, then install stand-off washer 50 to capture and secure the screw 50 on the support plate 23.

Figure 7:
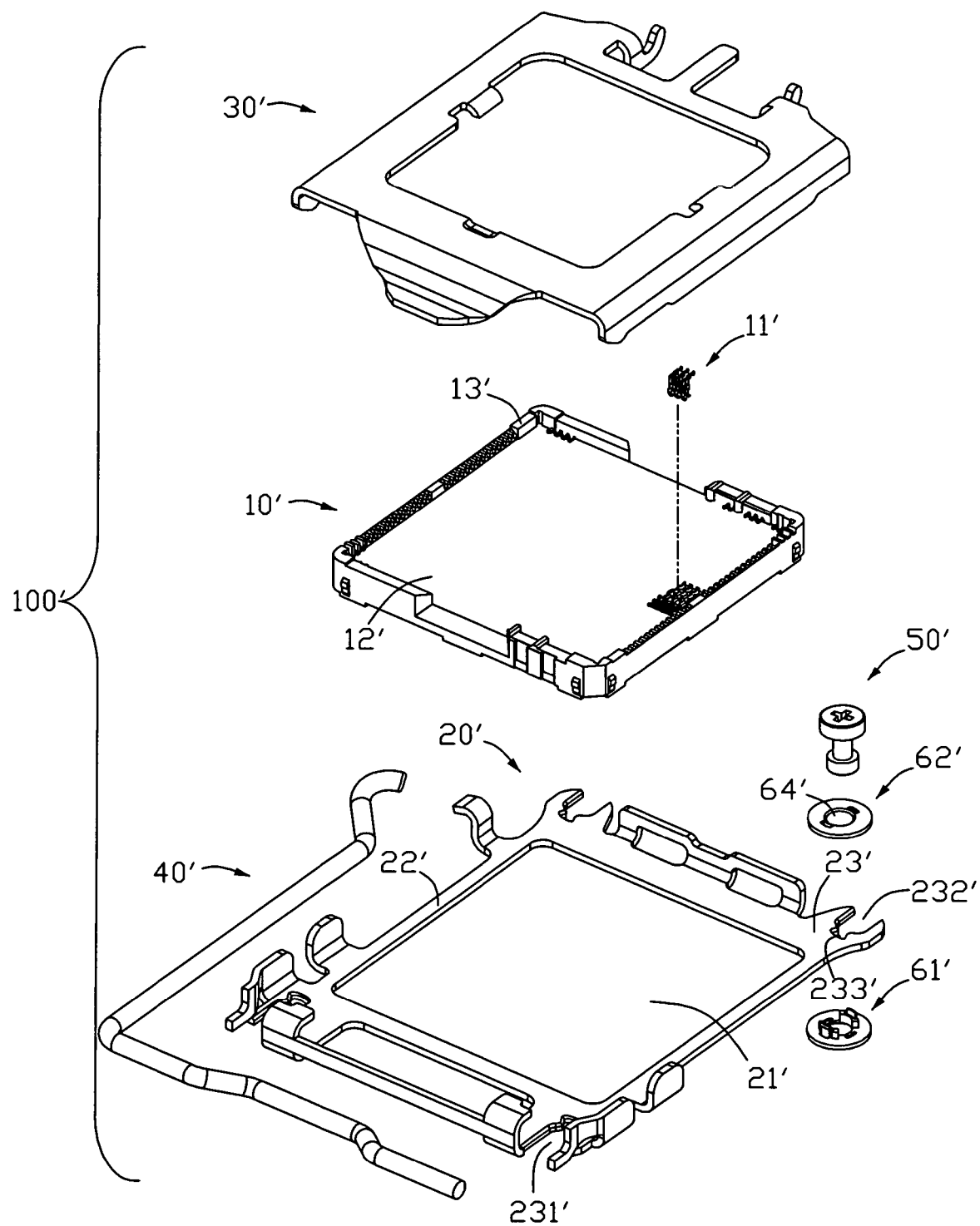
FIG. 7 is an exploded isometric view of an LGA socket in accordance with a second embodiment of the present invention.
Figure 8:
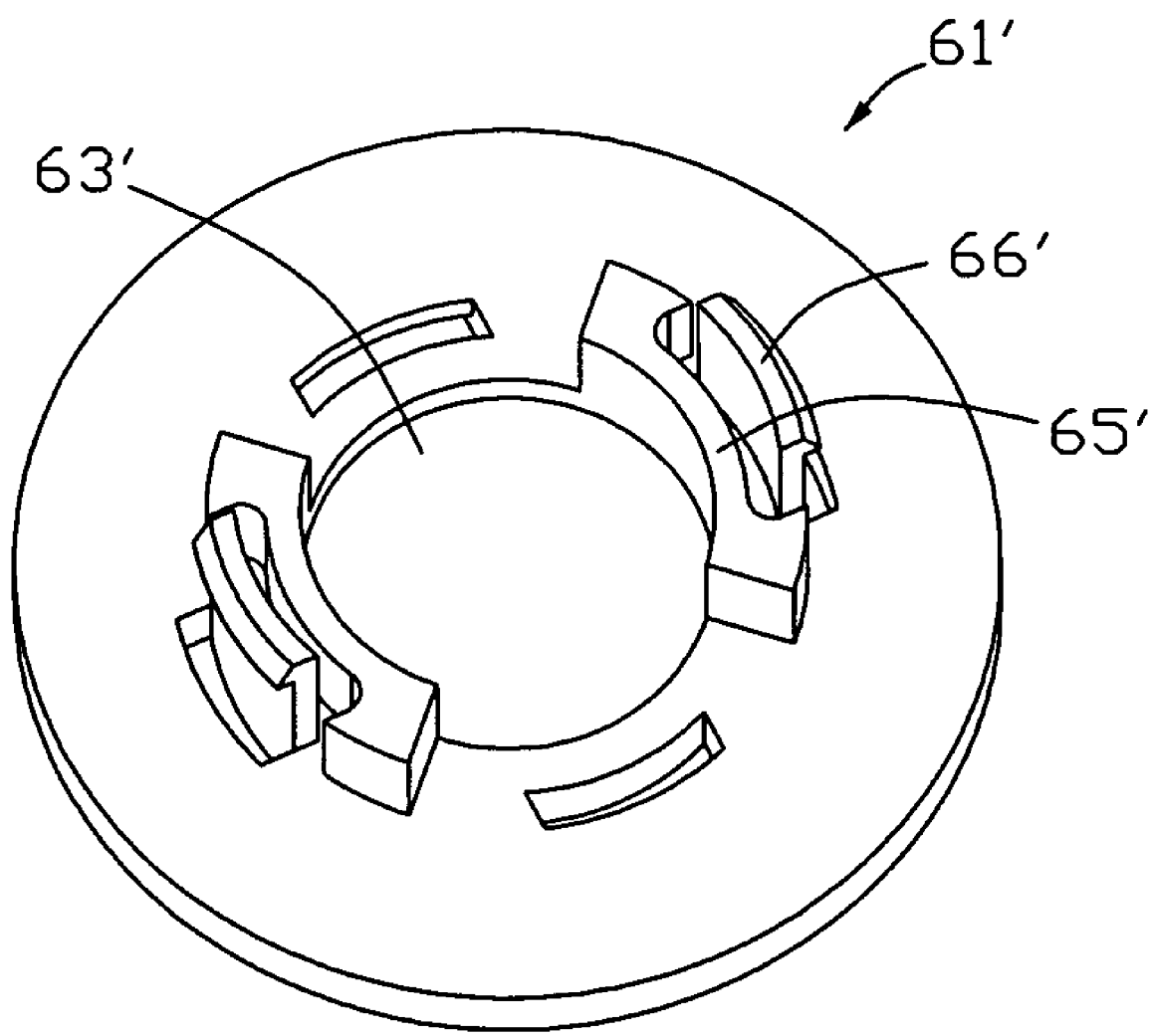
FIG. 8 is an isometric view of a washer of the socket shown in FIG. 7.
Figure 9:
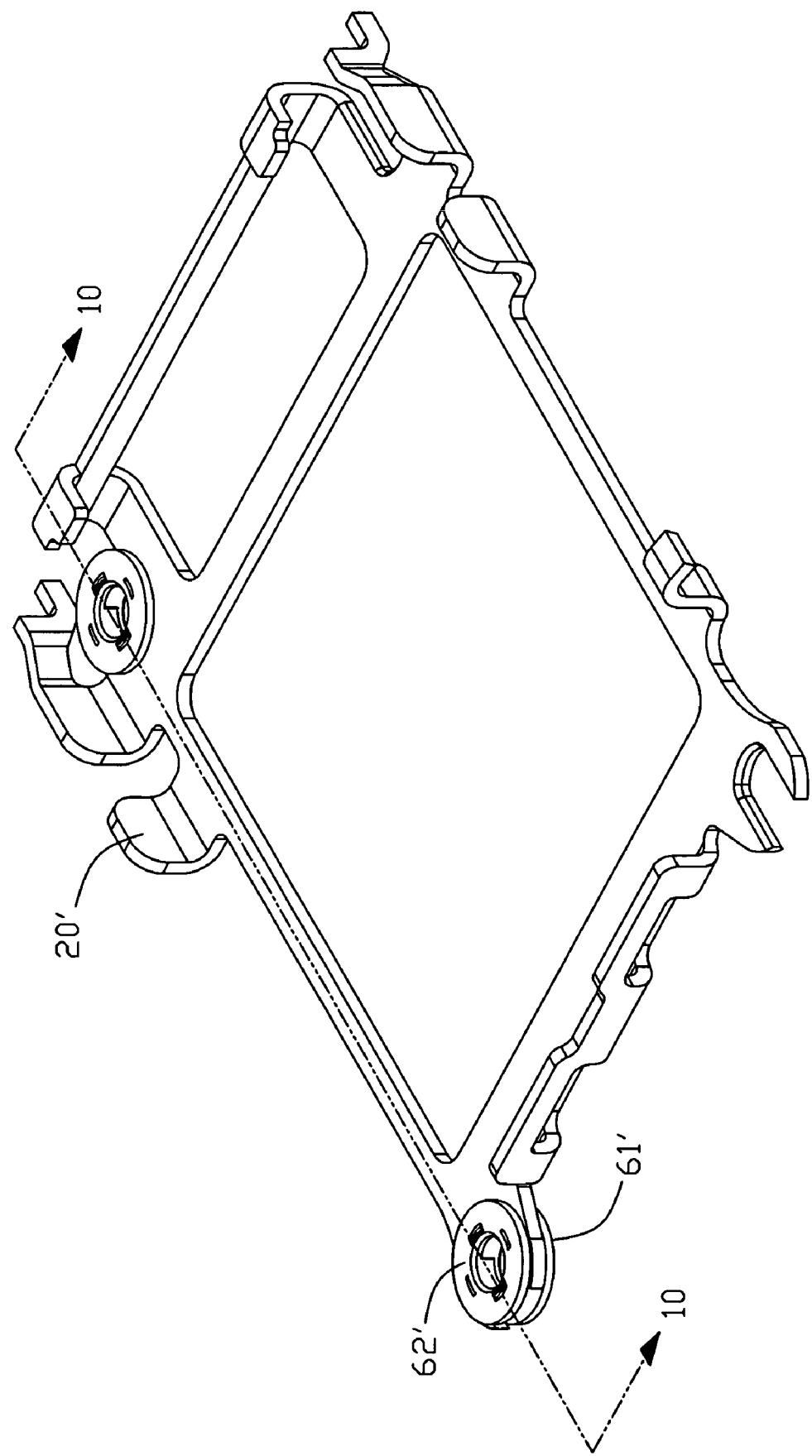
FIG. 9 is an assembled view of the stiffener and the latch mechanism, showing each of the slots assembled with a top washer and a bottom washer.
Figure 10:
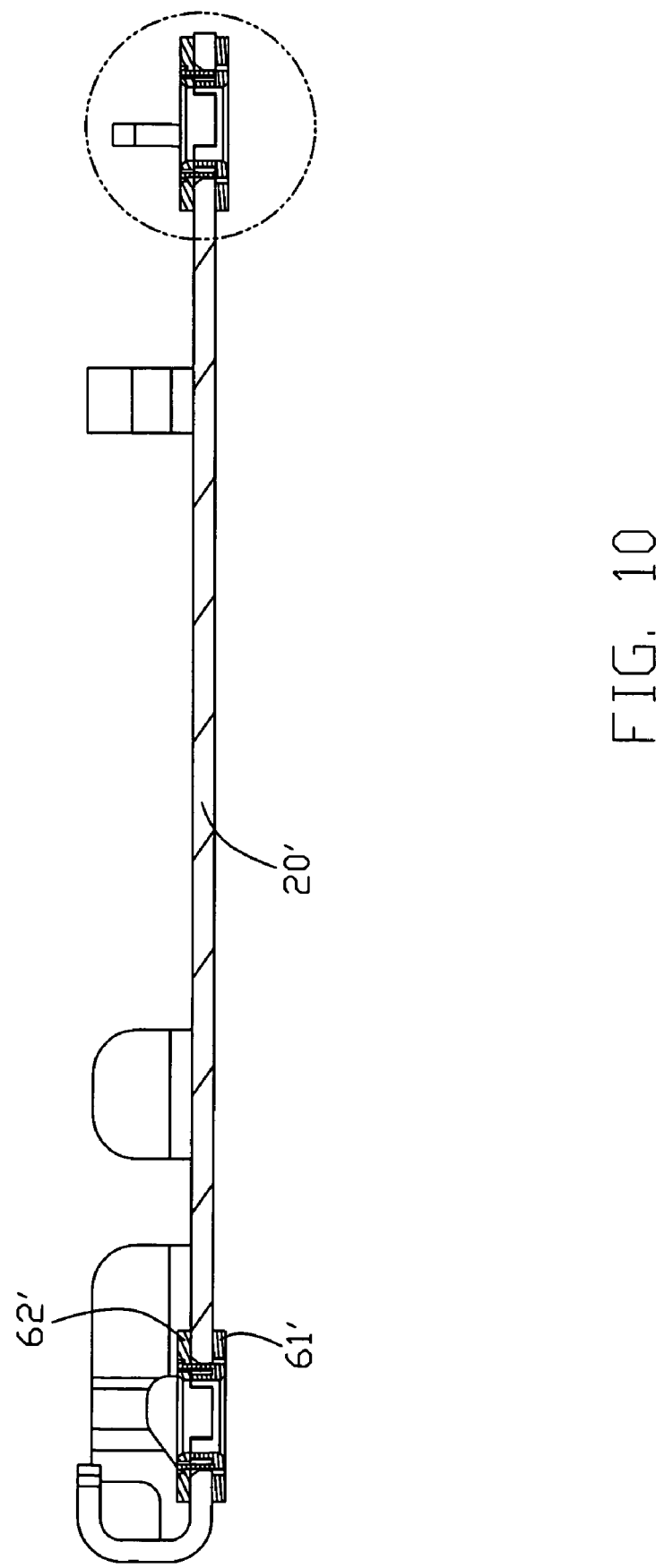
FIG. 10 is a cross-sectional view along line 10-10 in FIG. 9.
Figure 11:
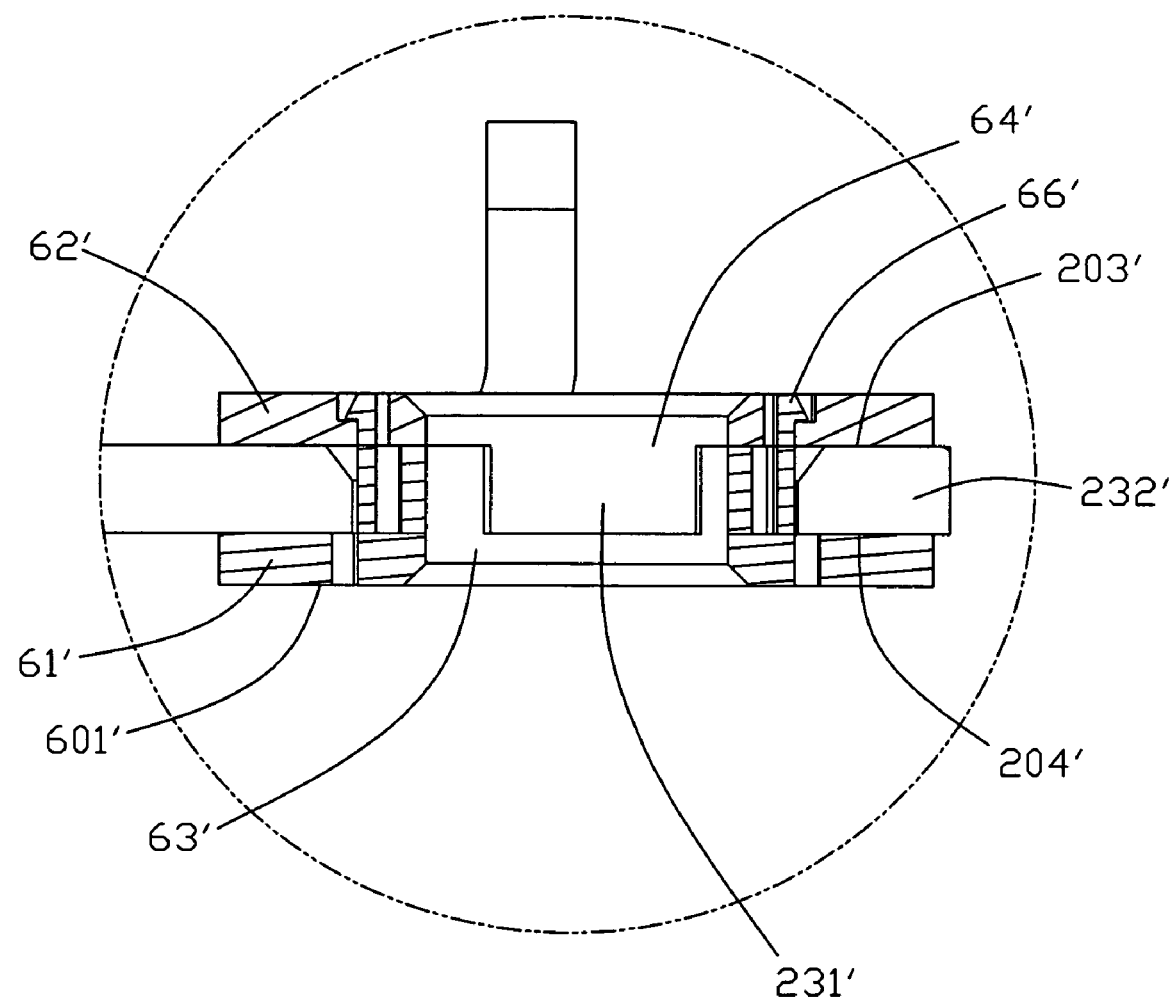
FIG. 11 is an enlarged view of the circle portion X in FIG. 10.

Referring to FIG. 7, an LGA socket 100' according to a second embodiment of the present invention comprises an insulative housing 10', a metallic stiffener 20' surrounding the insulative housing 10', a plurality of conducive terminals 11' received in the insulative housing 10', a load plate 30' pivotally assembled to one end of the stiffener 20', a load lever 40' pivotally assembled to the other end of the stiffener 20', and a locking mechanism attached to the stiffener 20'. The structure of the socket 100' is similar to the first embodiment except the latch mechanism.

The insulative housing 10' defines a recessed conductive region 12' surrounded by two pairs of sidewalls 13'. The terminals 11' are fixed in the conductive region 12'.

The metallic stiffener 20' is formed by stamping form a metallic sheet. The stiffener 20' defines an opening 21' in a middle portion thereof for receiving the insulative housing 10'. The opening 21' is generally rectangular and is surrounded by two pairs of bottom plates 22'. The stiffener 20' comprises a plurality of support plates 23' at corners thereof and surrounding the opening 21'. Each support plate 23' defines a side-opening slot 231'. The stiffener 20' defines an upper surface 203' and a lower surface 204' opposite to the upper surface 203'. The slots 231' extend through the upper surface 203' and the lower surface 204' in a vertical direction. The support plate 23' further defines a cut-out 232' communicated with the slot 231' at an outer side thereof and a notch 233' at an inner side thereof.

Referring to FIGS. 8-11, the locking mechanism including a screw 50' attached to the slot 231' of the support plate 23' in a horizontal direction, a top washer 62' attached to the support plate 30', and a bottom washer 61' secured between the screw 50' and the support plate 23'. The top and bottom washers 62', 61' are attached to the support plate 23' in a vertical direction and engage with each other. The top and bottom washers 62', 61' each are provided with a close through hole 64', 63' for the screw 50' passing through in a vertical direction. The bottom washer 61' defines a flat bottom surface 601' projecting downwardly from the support plate 23'. The bottom washer 61' comprises a plurality of snapped sections 66' for locking with the top washer 62'. The bottom washer 61' further includes a plurality of retaining sections 65' adjacent to the snapped sections 232' and received in the notches 233' thereby capturing the support plate 23.

The screw 50' comprises a head 51' supported on the support plate 23' at one end and a cylindrical shaft 52' at other end with a thread 23' formed thereon. The diameters of the head 51' and the thread 53' are more than the diameter the cylindrical shaft 52'. The diameter of the slot 231' on the support plate 23' is less than the diameter of the thread 53' of the screw 50'. The length of the cut-out 232' is substantially equal to the diameter of the screw 50' so that the screw 50' can be inserted into the slot 231' through the cut out 232'. The screw 50' is movably along the vertical direction and is limited in a horizontal plane. In assembly, push the screw 50' into support plate 23' through the cut-out 232', then install the top and bottom washers 62', 61' to capture and secure the screw 50 on the support plate 23.

The screw 50, 50' is a standard captive screw without additional components so that ODMS need not to deal with the screw suppliers. The cost of the screws can be reduced. Furthermore, the screws 50, 450' are attached to the stiffener 20 during product shipment and before mount to PCB. Therefore, not only simplify the assembly line process but also reduce the assembly time. In the present invention, the washer 60, 61' also work as a stand-off from the PCB side and keep the LGA socket on the PCB. Although, the stiffener of the present invention is an intergrated configuration, it also could be a plurality of separated parts and the support plates are formed on the separated parts.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

I claim:

1. An LGA socket comprising:
   an insulative housing defining a conductive region surrounded by two pairs of sidewalls;
   a plurality of conductive terminals received in the conductive region;
   a stiffener surrounding the insulative housing and including a plurality of support plates at corners thereof;
   a load plate and a load lever pivotally assembled to the stiffener;
   a screw attached to support plate in a horizontal direction, wherein the screw comprises a head supported on the support plate at one end and a cylindrical shaft at other end with a thread formed thereon, and wherein the diameters of the head and the thread are more than the diameter of the cylindrical shaft; and a stand-off located under the support plate and provided with a through hole for the screw passing through in a vertical direction, wherein the support plate defines a slot, and the diameter of the slot is less than the thread of the screw.

2. The LGA socket as claimed in claim 1, wherein the stand off comprises a plurality of snapped sections for engaging with the support plate.

3. The LGA socket as claimed in claim 2, further comprising a gasket secured between the screw and the support plate.

4. The LGA socket as claimed in claim 1, wherein the stand off comprises a top washer and a bottom washer engaged with each other and sandwiching the support plate therebetween.

5. The LGA socket as claimed in claim 4, wherein the bottom washer comprises a plurality of retaining sections for capturing the support plate.

6. The LGA socket as claimed in claim 1, wherein the screw is movably along the vertical direction and limited in a horizontal plane.

7. An electrical connector comprising:
an insulative housing;
a metallic stiffener surrounding said housing;
a through hole located around a corner of the stiffener with a slot extending through a corresponding edge to transversely communicate with an exterior;
a locking mechanism defining a shaft with a larger head and a larger bottom threaded section at two opposite ends under a condition that said shaft is received and installed in the through hole through said slot in a horizontal direction, and a washer attached to the stiffener and defining another through hole through and beyond which said bottom threaded section extends downwardly;
wherein a transverse dimension of the slot is not smaller than a diameter of the shaft while being smaller than those of both said head and said bottom threaded section.

8. The electrical connector as claimed in claim 7, wherein said washer is positioned under the stiffener and functions as a standoff when said connector is mounted to a printed circuit board.

9. The electrical connector as claimed in claim 8, wherein said washer includes a protrusion extending into the slot to block transversely communication between the though hole and the exterior in said horizontal direction so as to prevent withdrawn of the locking mechanism from the stiffener.

10. The electrical connector as claimed in claim 7, wherein said washer is detachable from the stiffener.

11. The electrical connector as claimed in claim 7, wherein said washer includes a snapping section grasping the stiffener.

12. The electrical connector as claimed in claim 7, wherein said another through hole in the washer defines a diameter larger than that of the bottom threaded section.

13. The electrical connector as claimed in claim 7, further including a gasket between the head and the stiffener, wherein said gasket defines a through hole with a diameter larger than that of the bottom threaded section while smaller than that of the head.

* * * * *